United States Patent [19]

Wells et al.

[11] Patent Number: 5,448,577
[45] Date of Patent: Sep. 5, 1995

[54] METHOD FOR RELIABLY STORING NON-DATA FIELDS IN A FLASH EEPROM MEMORY ARRAY

[75] Inventors: Steven E. Wells, Citrus Heights; Robert N. Hasbun, Shingle Springs, both of Calif.

[73] Assignee: Intel Corporation, Santa Clara, Calif.

[21] Appl. No.: 969,464

[22] Filed: Oct. 30, 1992

[51] Int. Cl.$^6$ .......................................... H03M 13/00
[52] U.S. Cl. ...................................... 371/40.1
[58] Field of Search ................ 371/10.1, 10.2, 21.1, 371/21.2, 21.3, 37.1, 40.1, 51.1

[56] References Cited

U.S. PATENT DOCUMENTS

| | | | |
|---|---|---|---|
| 4,295,219 | 10/1981 | Draper et al. | 371/51.1 |
| 4,642,759 | 2/1987 | Foster | 395/500 |
| 4,644,494 | 2/1987 | Muller | 395/425 |
| 4,763,305 | 8/1988 | Kuo | 365/200 |
| 4,802,117 | 1/1989 | Chrosny et al. | 371/10.1 |
| 4,896,262 | 1/1990 | Wayama et al. | 395/500 |
| 4,958,315 | 9/1990 | Balch | 395/500 |
| 5,012,425 | 4/1991 | Brown | 364/464.02 |
| 5,070,474 | 12/1991 | Tuma et al. | 395/500 |
| 5,072,449 | 12/1991 | Enns et al. | 371/37.1 |
| 5,077,737 | 12/1991 | Leger et al. | 371/10.1 |
| 5,101,490 | 3/1992 | Getson, Jr. et al. | 395/425 |
| 5,111,385 | 5/1992 | Hattori | 395/425 |
| 5,131,089 | 7/1992 | Cole | 395/500 |
| 5,199,033 | 3/1993 | McGeoch et al. | 371/10.1 |
| 5,200,959 | 4/1993 | Gross et al. | 371/21.6 |
| 5,224,070 | 6/1993 | Fandrich et al. | 365/185 |
| 5,285,456 | 2/1994 | Cheney et al. | 371/51.1 |
| 5,297,148 | 3/1994 | Harari et al. | 371/10.2 |

FOREIGN PATENT DOCUMENTS

| | | | |
|---|---|---|---|
| 2088442 | 7/1993 | Canada | 13/16 |
| 0175458A2 | 3/1986 | European Pat. Off. . | |
| 0392895 | 10/1990 | European Pat. Off. | 16/06 |
| 2251323 | 1/1992 | United Kingdom | 12/02 |
| 2251324 | 1/1992 | United Kingdom | 12/02 |

OTHER PUBLICATIONS

Solid-State Mass Storage Arrives, Product Feature, Memory Card Systems & Design, Jul./Aug. 1992.
Optimal Solid State Disk Architecture for Portable Computers, Dan Auclair, pp. 811–815, Proceedings of Silicon Valley P.C. Design Conference, Jul. 9, 1991.

*Primary Examiner*—Roy N. Envall, Jr.
*Assistant Examiner*—Chuong D. Ngu
*Attorney, Agent, or Firm*—Blakely, Sokoloff, Taylor & Zafman

[57] ABSTRACT

A method for utilizing a cyclical redundancy check value with an identification field stored in memory which is constantly changing between testing of the cyclical redundancy check value. In order to allow the use of a cyclical redundancy check value with a field which constantly varies as does the field in a flash EEPROM memory array, various portions of the field are masked to the cyclical redundancy check and additional reliability checks are utilized to assure that those portions which are masked remain reliable.

24 Claims, 4 Drawing Sheets

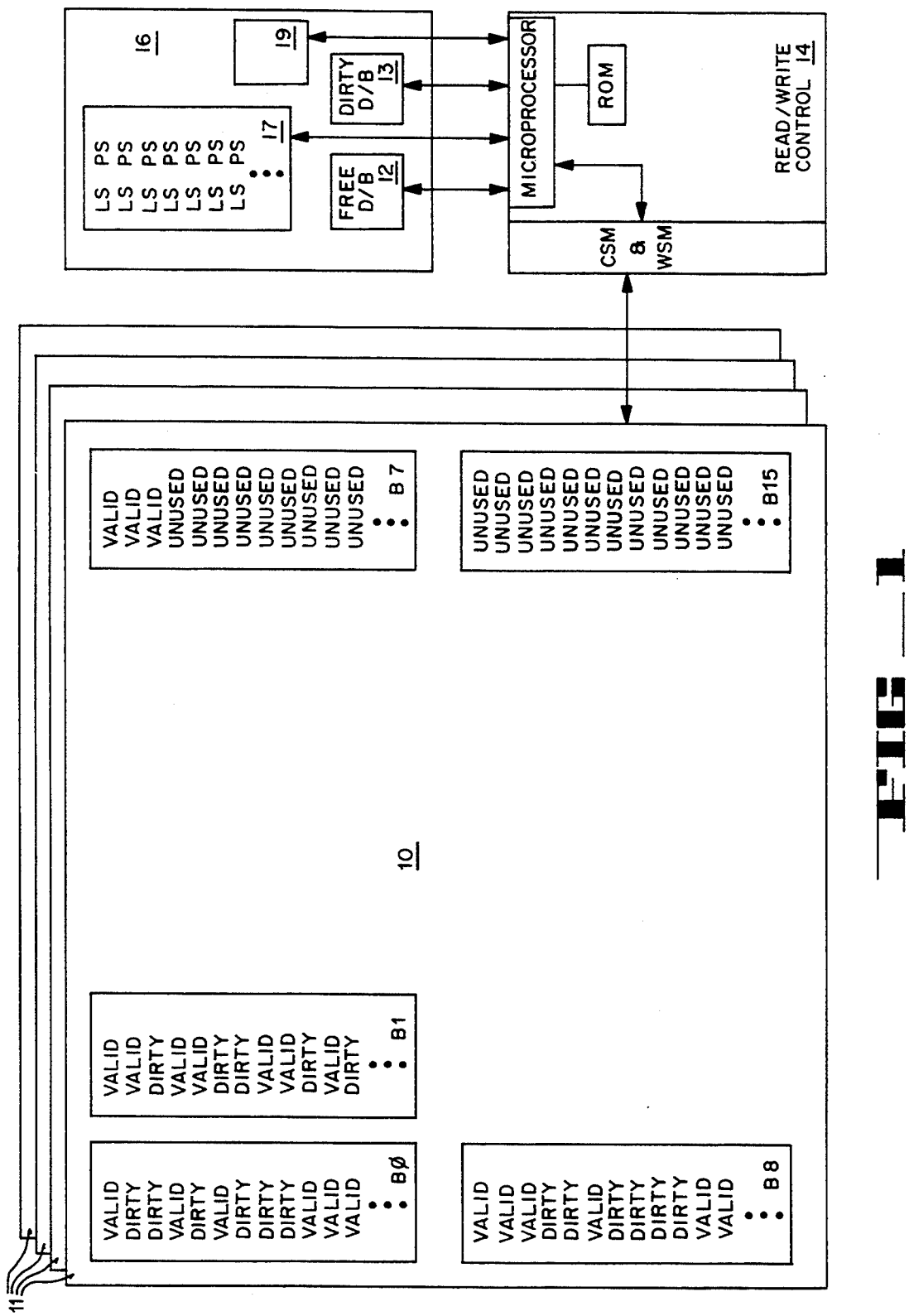
FIG_1

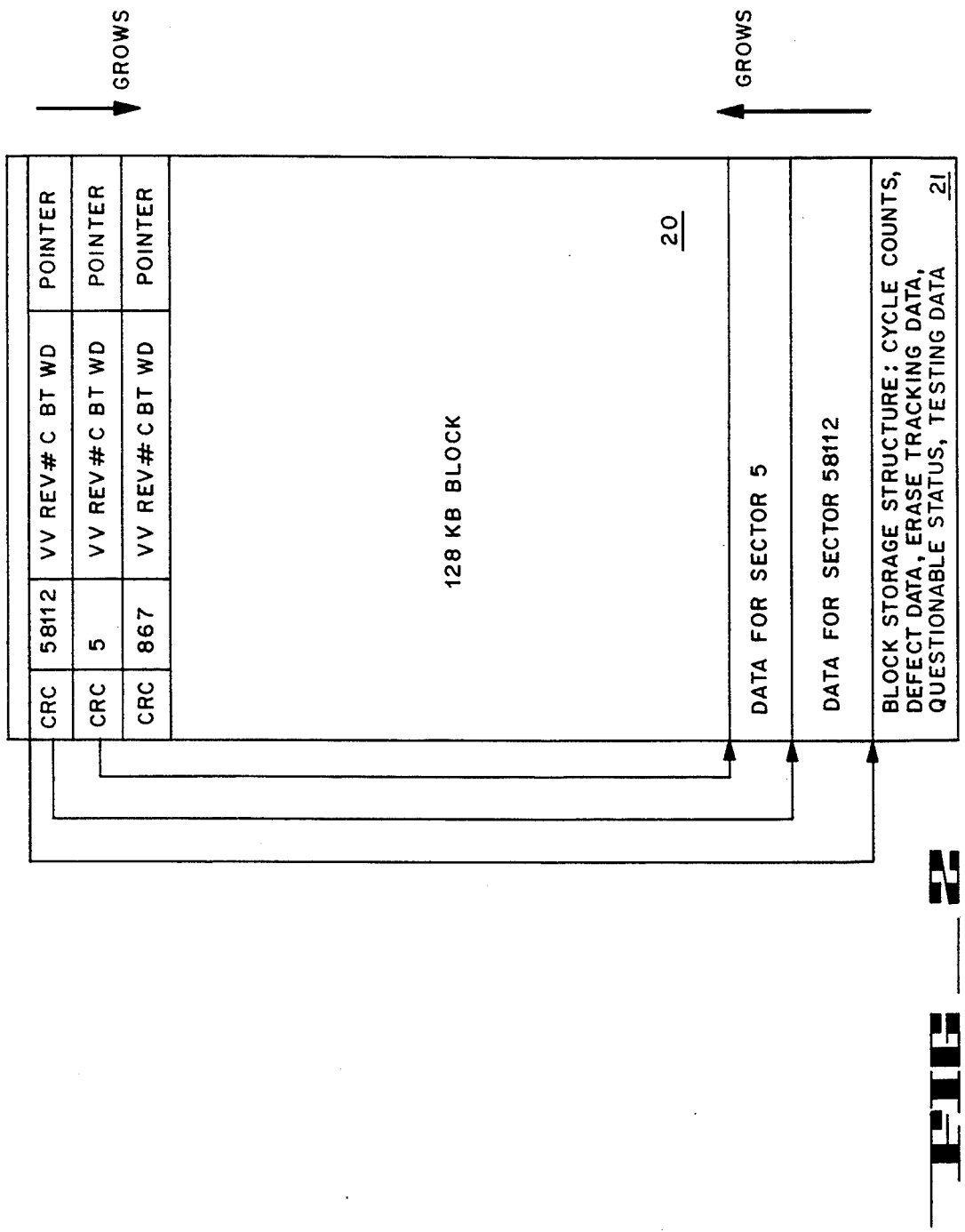
FIG_2

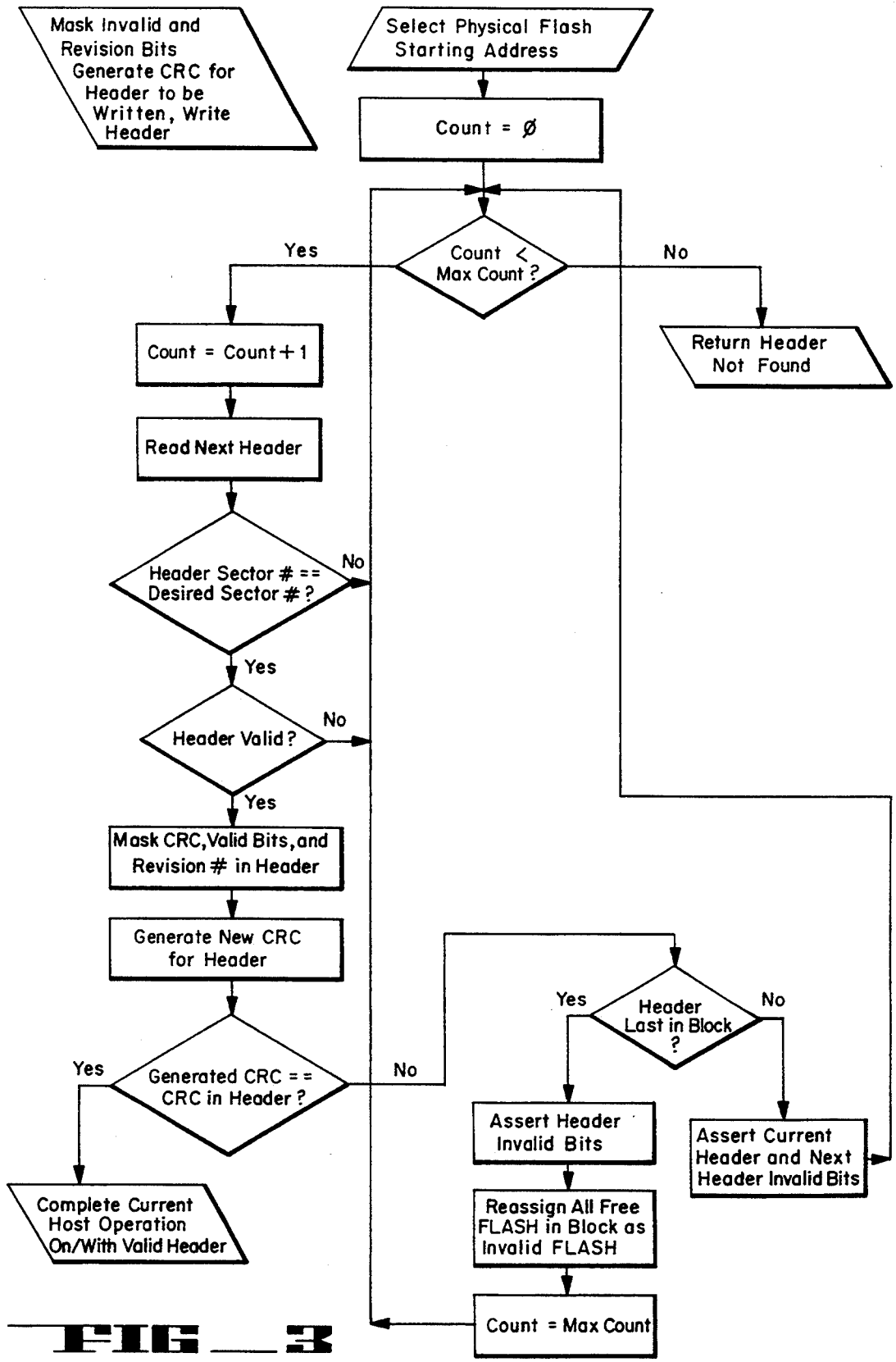
FIG_3

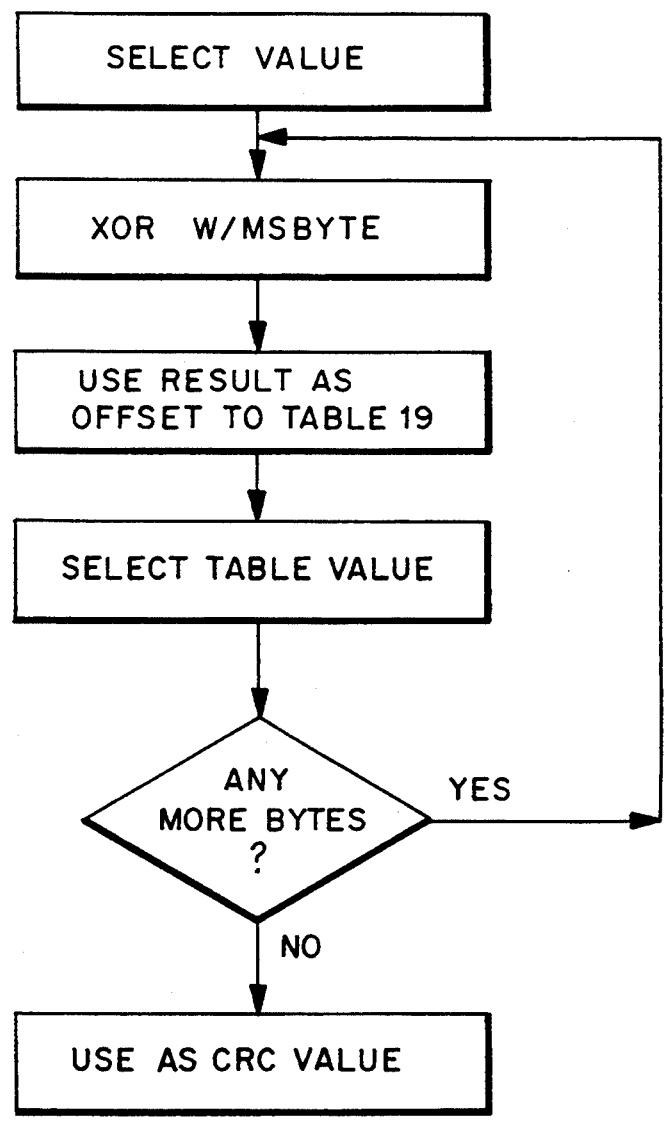
FIG_4

METHOD FOR RELIABLY STORING NON-DATA FIELDS IN A FLASH EEPROM MEMORY ARRAY

BACKGROUND OF THE INVENTION

1. Field Of The Invention

This invention relates to flash electrically-erasable programmable read-only memory (flash EEPROM) arrays and, more particularly, to methods for reliably storing identifying fields associated with each sector of data stored in such arrays.

2. History Of The Prior Art

Modern computer systems make extensive use of long term memory. Typically this memory is provided by one or more electro-mechanical hard (fixed) disk drives made of flat circular magnetic disks which rotate about a central axis and which have a mechanical arm to write to or to read from positions on the magnetic disk. Hard disk drives are very useful and have become almost a necessity to the operation of personal computers. However, such electro-mechanical drives are relatively heavy, require a significant amount of space within a computer, require a significant amount of the power in use, and are very susceptible to shock.

Recently, forms of long term storage other than electro-mechanical hard disk drives have become feasible for use in computers. One of these is flash EEPROM. A flash EEPROM memory array includes a large plurality of floating-gate field effect transistors arranged as memory cells in typical row and column fashion with circuitry for accessing the individual cells and placing the memory transistors of those cells in one of two memory conditions. A flash memory cell, like a typical EPROM cell retains information when power is removed; however, the condition of the cells of a flash EEPROM array may be changed electrically while the array is in place in a host. Flash EEPROM memory has a number of attributes which adapt it to use as long term memory. It is light in weight, occupies very little space, and consumes less power than electro-mechanical disk drives. It is especially rugged and withstand without adverse effects repeated drops each of which would destroy a typical electro-mechanical hard disk drive.

Flash EEPROM memory arrays are by their nature extremely reliable. The inherent reliability of transistors compared to magnetic media causes this to be true. It has been estimated that while electro-mechanical hard disk drives average a raw media failure once every $2^{14}$ bits, flash EEPROM arrays will produce such an error approximately once every $2^{19}$ bits. Thus, flash EEPROM array is substantially less likely to fail than are electro-mechanical hard disk drives. For this reason, there have before this time been no attempts to enhance the reliability of the storage of data in such arrays. Now, however, attempts are being made to ensure the reliability of the data stored in flash EEPROM array. For example, a method of improving read reliability is disclosed in U.S. patent application Ser. No. 07/969,756, entitled Method and Apparatus to Improve Read Reliability in Semiconductor Memories, S. Wells et al, filed Oct. 30, 1992, and assigned to the assignee of the present invention.

However, the information stored in any long term storage array includes not only the data itself but a field stored with each sector of data to identify that data so that it may be used. No known attempt has been made to enhance the reliability of the storage of these identification fields in flash EEPROM arrays.

SUMMARY OF THE INVENTION

It is, therefore, an object of the present invention to provide a method for enhancing the reliability of non-data fields stored in a flash EEPROM memory array.

These and other objects of the present invention are realized in a method for utilizing a cyclical redundancy check value with an identification field stored in memory. In order to allow the use of a cyclical redundancy check value with a field which constantly varies as does the field in a flash EEPROM memory array, various portions of the field are masked to the cyclical redundancy check and additional reliability checks are utilized to assure that those portions which are masked remain reliable. These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a block diagram illustrating a flash EEPROM memory array in which the present invention may be used.

FIG. 2 is a diagram illustrating an individual block of the flash EEPROM memory array of FIG. 1.

FIG. 3 is a flow chart illustrating a method in accordance with the present invention.

FIG. 4 is a flow chart illustrating a portion of the method illustrated in FIG. 3.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. In all cases the distinction between the method operations in operating a computer and the method of computation itself should be borne in mind. The present invention relates to a method for operating a computer in processing electrical or other (e.g. mechanical, chemical) physical signals to generate other desired physical signals.

DETAILED DESCRIPTION

Flash EEPROM memory is essentially an EPROM array divided into blocks which are connected so that an entire block of memory cells may be erased simultaneously. With complimentary metal-oxide-silicon (CMOS) memory cells this is accomplished by a high voltage value applied simultaneously to the source terminals of all the memory transistors of the block. Such an erasure places each of the cells in the one condition. When in that condition, a zero or a one may be written to a cell. A one leaves the cell in the same one condition while a zero switches the cell to the zero condition. A cell cannot be switched back from the zero condition to the one condition without the application at its source terminal of the high value of voltage required for erasure. Since all source terminals of the memory transistors of a block are joined together, a cell in a zero state remains in that state until the entire block of the array is erased once again.

While an electro-mechanical hard disk drive will typically store information in a first area of the disk and then rewrite that same area of the disk when the information changes, this is not possible with a flash memory array without erasing all of the valid information that remains in that portion of the array along with the invalid (dirty) information.

Because of this, in a recently devised arrangement, the entire array is divided into separately erasable blocks so that when a block is erased the amount of valid data which must be reprogrammed is reduced. When the information at a data entry changes, the changed information is written to a new sector on an available block rather than written over the old data; and the old data is marked dirty. This, rather than writing over the old information, occurs because to erase an entire block without destroying valid data would entail copying all of the valid data to another block of the array, erasing the original block, rewriting the valid data back to the original block, then rewriting the updated data over the old entry on the original block. Consequently, only after a sufficient number of sectors on a block have been marked dirty, is the entire block erased.

When erasure occurs, all of the valid data in the block to be erased is written to a new block; and then the dirty block is erased and put back into use as a clean block of memory. Because of this involved erasure process, it typically takes as much as two seconds to erase a block of a flash EEPROM array. However, because erasure need not occur with each entry which is rewritten, erasure may be delayed until a block contains a sufficient amount of dirty information that cleanup is feasible. This reduces the number of erasure operations to a minimum and allows erasure to occur in the background when the facilities for controlling the array are not otherwise occupied with reading and writing. Such an arrangement is described in U.S. patent application Ser. No. 07/969,131, entitled Method And Circuitry For A Solid State Memory Disk, S. Wells, filed Oct. 30, 1992, and assigned to the assignee of the present invention.

Referring now to FIG. 1, there is illustrated in block diagram form a flash EEPROM memory array 10 such as that disclosed in the above-mentioned patent application in which the present invention may be practiced. The array 10 includes a plurality of blocks B0–B15 of flash EEPROM memory. Each block includes floating-gate field effect transistor memory devices or cells (not shown) arranged in typical row and column fashion and having circuitry arranged for selecting any particular block of memory and any particular row and column so that the memory device at that position may be written or read. The details of the layout of transistor memory arrays and the associated accessing circuitry are well known to those skilled in the art and are, therefore, not shown here.

In the array 10 illustrated in FIG. 1, blocks B0–B15 of memory are shown positioned on a first chip 11 of the array 10. Additional silicon chips 11 each hold additional blocks of the array 10 to provide a total number of blocks sufficient to furnish the desired size of memory array.

Once any one of the blocks has been erased, data may be written to any position on the entire block. When, a host begins writing the data to be stored in the array to some block of the array having free space, the data to be stored in the array 10 is written sequentially, sector by sector, to the free space in this first block until that block has been filled with data. Then writing proceeds to the next sequential block having free space. At any point after writing is completed, the information may be read back from the array 10 by interrogating the block and sector at which the data is stored.

When updated information is to be written to a sector which already contains information, in contrast to the prior art, the updated information is written to new or newly-erased free space on some one of the unfilled blocks of the array 10 (e.g., block B7); and the old position is marked invalid (dirty). A block is usually not erased until a large number of dirty sectors exist and the number of valid sectors on that block which must be saved is substantially reduced.

Because of this arrangement by which data is replaced in the array by writing it to a different physical position, the sector number which is used to indicate where data is stored is really a logical sector number. In order to allow the use of logical sector numbers, a lookup table 17 listing each logical sector number with its physical position (the chip, block, and offset) is utilized with the array 10 so that the data in the array 10 may be accessed. This table 17 may be stored in random access memory 16 associated with the array 10. Since the addressing scheme used treats the host address as a logical address and records that logical address along with the physical position in the table 17 in random access memory 16, this table 17 must be updated whenever data is written to the array.

Also, because of this arrangement by which data is replaced, each block of the array will after some time have a number of entries which are marked invalid and cannot be used for storage until the block has been erased. Consequently, as the array 10 fills with data, a point will come when it is necessary to clear out invalid data from a block in order to provide space for new data to be stored. Typically, the dirtiest block of the array 10 is chosen for erasure. This allows the smallest amount of valid data to be moved to another block of the array from the block to be erased. Once the valid data is written to another block and the new physical addresses are recorded in the lookup table 17, the block from which the information was read is erased. It is then placed back into operation as an entirely clean block.

FIG. 2 is an idealized drawing which illustrates one embodiment of an individual block of the array 10 and is useful in describing the way data is stored. A typical block 20 is illustrated as a rectangular area. The area includes a plurality of transistor devices typically arranged in rows and columns to provide the desired storage. The individual transistors and the various column and row select lines and other conductors for operating the block are not illustrated but are well known to those skilled in the art of designing flash memory.

As may be seen in FIG. 2, information is stored in the block 20 beginning at the top of the block and near to the bottom. At the top of the block 20 are stored identification fields which include the logical sector numbers used by the operating system as addresses for the data. These identification fields are referred to as sector translation tables or "headers." For example, a first sector number 58112 is stored as a part of the first header at the top. In the header with the sector number are stored a number of other different fields of information. These include a cyclical redundancy check value, a pointer value, and a set of attributes. These fields allow the accurate retrieval of data in the sector.

The pointer value points to a physical address on the block 20 which is an offset (from the beginning of the block) at which the data for logical sector 58112 is stored. Arrows in FIG. 2 illustrate the physical position at which the first byte of data for each of the logical sectors is stored. In the case of logical sector 58112, which is the first sector on the block 20, the data is written from the byte at the position indicated by the pointer stored with the sector number 58112 in the header to a point at the beginning of the entire data storage area which is marked by a pointer value indicating the beginning of the data storage area (illustrated by an arrow extending from the upper left hand corner of the block 20). FIG. 2 also shows a second logical sector 5 and its pointer directed to a physical position on the block 20 which stores the first byte of the data for sector 5. A third header includes a logical sector number 867, and one of the bits (labelled WOD) in the attribute field of the header for sector 867 indicates that the sector does not include data.

The attributes included in the attribute field in one embodiment are an indication of the validity of the entry, a revision number, an indication whether the data is compressed or not, a bit which indicates a bad track, and a bit which indicates whether the entry includes data (WD in FIG. 2 indicates data is stored in the sector and WOD indicates no data is stored). The indication of the validity of the entry stores at least one bit which indicates valid when it is a one value and invalid when it is a zero value; in an embodiment used in the present invention, two bits are used and both must be ones to indicate a valid entry. The valid bits are changed to zero when a data entry is marked dirty. The revision number is, in one embodiment, a four bit number. This revision number changes at times during the life of the data in a sector as is explained in U.S. patent application Ser. No. 07/969,463, now U.S. Pat. No. 5,341,330 entitled Method For Writing To A Flash Memory Array During Erase Suspend Intervals, S. Wells et al, filed Oct. 30, 1992, and assigned to the assignee of the present invention. The bad track bit indicates that the media is damaged. The bit which indicates whether the entry includes data or not is utilized to allow sectors to be created without data. This allows information regarding the condition of sectors to be transferred to the host even though those sectors have not been used to store data or are not presently in use. In one embodiment, a header requires only four words (eight bytes) of memory in the array whereas a sector of data may use as much as 512 bytes of memory in addition to the header space so writing a header without data saves substantial space in the array.

This manner of providing data storage space for a sector allows the amount of data written to a logical sector to vary. In one embodiment, a sector may be a typical 512 byte sector size or less. Since the data for each new sector is written in all of the rows immediately above the data for the last-written sector, only a trivial amount of data space is wasted. This storage design allows data to be compressed. When the data being sent to storage is compressed, the amount of storage space normally left empty in a fixed size storage arrangement may be eliminated.

As was pointed out above, the physical position (including the chip number, the block, and the offset for retrieving the data) of the sector is stored with the logical sector number in the lookup table 17 in random access memory 16. Because the size of a sector varies, the data stored in any sector of the block 20 is retrieved by retrieving the physical position of the sector having the logical sector number from the table 17, going to the header on the block 20 where the sector number is stored, and retrieving the pointer to the beginning position of the data and the pointer to the beginning position of the sector whose number is stored in the header immediately above header storing the sector number being retrieved. These two values determine the starting and ending positions (its size) for the sector the data of which is sought. These two values must be accurate for reliable data to be furnished from the sector to the host.

An arrangement has been devised to control the operation of the programming, reading, and erasing of the flash EEPROM memory array. This arrangement is shown as a read/write control circuit 14 in FIG. 1. The control circuit 14 utilizes a microprocessor such as the Intel 80188 processor to execute various processes stored in read only memory within the control circuit 14. These processes utilize random access memory 16 and provide various services which allow the array 10 to be utilized as long term storage in the manner described. One of these processes is the cleanup process used to erase blocks with a large number of dirty sectors. Another is a process to update the lookup table 17 each time the position of a sector changes.

The control circuit 14 shown in FIG. 1 is also illustrated as including a command state machine which provides a command interface between the control circuit 14 and the flash EEPROM memory array. In one embodiment, the command state machine and the write state machine actually reside on each of the chips 11. The command state machine controls the programming, reading, and erasing of the flash EEPROM memory array. The command state machine using the write state machine sequences the transfer of data to and from the flash EEPROM memory array so that the operations involved in accomplishing the writing to, the reading from, and the erasure of the array take place correctly. In running processes to provide services to the array, the microprocessor of the circuit 14 may make use of various operations provided by the command state machine. Details of the command state machine and the write state machine are disclosed in U.S. patent application Ser. No. 07/655,643, entitled Command State Machine, Fandrich et al, filed Feb. 11, 1991, and assigned to the assignee of the present invention, and in U.S. patent application Ser. No. 07/654,375, entitled Circuitry and Method For Programming and Erasing A Non-volatile Semiconductor Memory, Kynett et al, filed Feb. 11, 1991, and assigned to the assignee of the present invention.

Because they control all information passed between the host and the memory array, the microprocessor and the command state machine of the control circuit 14 are able to control the operations so that the external host which is writing to and receiving information from the flash EEPROM array is typically not aware that an erasure is taking place even though the erasure may require one or two seconds.

The normal manner in which the writing of data to the array takes place is as follows. Each sector of data is provided by the host with the number of the logical sector to which it is to be written. The controller 14 looks up the sector number in the table 17 and seeks the present physical position of the sector in the array. The controller then finds the sector header in the block of the array on which it is positioned. The controller 14 marks the old sector header invalid by zeroing the valid bits in the header, then assigns free space (space not already assigned to a sector) to the sector on some block of the array, and writes a new header to the free space. This header includes, among other things, the logical sector number, a pointer to a position on the block at which the data will commence, and an indication that data is attached. As will be discussed below, the header also includes space for a cyclical redundancy check value computed from the data. The controller then writes the data furnished by the host to the data space at the new entry position for the sector and computes a cyclical redundancy check value. The writing of changed data to a new physical address requires that the entry in table 17 be updated with the new physical position of the sector in the array.

This places the table 17 in condition so that the changed (new information) may be recovered. This also leaves the old sector marked invalid so that it may be cleaned up when a sufficient number of sectors on the block have been marked dirty. The invalid indication stored with the old entry and the valid indication with the new entry also allow the lookup table 17 to be accurately constructed by a process run on the microprocessor of the circuit 14 after power is removed and reapplied.

Because the space marked dirty on a block cannot be released for use until the entire block is erased, each block of the array will after some time have a number of entries which are marked dirty and cannot be used for storage. Thus, the amount of dirty space in the array will mount as the array is used to store data. After some period of time, a sufficient number of blocks will be filled that it will be desirable to release space by moving the valid information from some especially dirty block to some other block and erasing the entire block from which the valid information has been removed. The process of writing valid data to other blocks and erasing a dirty block is referred to as "cleaning up a block" and has the effect of freeing an additional number of sectors equal to all of the sectors on the erased block which have previously been marked as dirty. Cleanup is one of the processes run by the microprocessor of the controller 14. Typically, when cleanup takes place, the dirtiest block of the array is chosen for erasure. This allows the smallest amount of valid data to be moved from the block being erased to another block of the array. The process is essentially similar to that by which data is written by the host except that the header is not completed until the valid data has been moved. The controller picks a block of the array to clean up. It finds a block of the array having free space. For each valid sector on the block being erased, the controller writes a header on the block containing the free space. This header includes only a pointer to the offset position on the block for the data for that sector. The controller 14 then writes the valid data from the old sector on the block being cleaned up. When the data has been written, the controller completes the header with the logical sector number, the cyclical redundancy check value, and the valid indication from the old header; this delay in completing the header allows the data to be invalidated at the old position if a write to the sector has taken place or other changes have occurred during the period in which the cleanup write operation is taking place. The controller then updates the table 17 for the sector and goes to the next valid sector on the block being cleaned up.

Once all of the valid information has been written to another block(s) and the new physical addresses have been recorded in the lookup table 17, the block from which the information was read is erased. It is then placed back in operation as an entirely clean block of free space.

In order to accomplish the cleanup process, the microprocessor of the controller 14 keeps a number of databases which contain the status of the array. A database 12 lists the amount of free space in the array and in each block of the array, and a database 13 lists the total amount of dirty space in the array and in the individual blocks of the array. In addition, the amount of free space on each block is stored in a block status area 21 (at the bottom of block 20 in FIG. 2). The cleanup process is described in detail in U.S. patent application Ser. No. 07/969,760, entitled A Method Of Cleaning Up A Solid State Memory Disk Storing Floating Sector Data, S. Wells, filed Oct. 30, 1992, and assigned to the assignee of the present invention.

Thus, it may be seen that for some sectors in an array, both the data in a valid sector and the header for the sector are constantly moving about the blocks of the array. Consequently, in contrast to electro-mechanical disk drives, the information in the header is constantly being rewritten to new positions even though the data is not changing. This offers a chance that the data stored in the header may be corrupted in one manner or another. The present invention has been devised to enhance the reliability of the storage of that data.

One embodiment of the present invention utilizes a cyclical redundancy check field in the header of each sector to provide a primary means of assuring reliability of the header data. The invention may also utilize an error detection and correction field in place of the cyclical redundancy check field to accomplish its purpose. Although the use of a cyclical redundancy check (and other similar error detection checks) may appear to be common in the handling of data, it has only been used in the prior art to assure that data is correctly transferred. Cyclical redundancy checks are typically used in communication programs to insure the accurate transmission of data. In the prior art, the problem of changing data is not encountered. In each prior art case, the data transferred is not changing between the time the first and second values are generated for the cyclical redundancy check. The problem of changing data is not encountered. The present invention uses a cyclical redundancy check to test data the value of which is changing between tests. The valid bits of the header change as a header is written, rewritten, and cleaned up; and the revision number changes as a header is moved. An electro-mechanical disk drive has a header but uses it only for position translations which do not change. Such a header does not include a valid bit at all or a revision number which changes as the data is moved. A valid bit is not required in the header of a electro-mechanical disk drive because the validity is kept in a file allocation table maintained by the host computer. A revision number is not required because the data is not moved once it has been stored in memory. Consequently, it is not obvious how such a cyclical redundancy check might be used with changing data.

The cyclical redundancy check utilized by the present invention uses a byte of storage space in the header. The entire header including the cyclical redundancy check value requires only four words (eight bytes of space). Thus, the cyclical redundancy check need only assure the accuracy of eight bytes of data. In embodiments of the invention using error detection and correction codes instead of a cyclical redundancy check value, a larger number of bytes might well be used to store the value.

Cyclical redundancy checks are well known to the prior art. For each portion of data, a cyclical redundancy check value is generated as a unique number. Then, when the reliability of the data is tested, a new cyclical redundancy check value is computed using the data; and the cyclical redundancy check value previously generated is compared with this new cyclical redundancy check value. If the data has changed in any way, the two cyclical redundancy check values will not compare; and the data will be rejected. The check thus detects errors in data. A description of the generation of cyclical redundancy check values is given in substantial detail in an article entitled "Implementing Cyclical redundancy checks," J. W. Crenshaw, published in the Jan. 1992 issue of *Embedded Systems Programming*.

In one embodiment of the present invention, the eight bit cyclical redundancy check is designed to provide single and multiple bit error detection and byte failure detection in the four words or eight bytes of the header.

A cardinal rule in the storage of data is that the host is not to be given data which is bad or of an unknown quality. To accomplish this, the process of the invention carried out by the microprocessor of the controller 14 operates in the following manner. FIG. 3 illustrates the steps of such a process. As a header for a sector is first written, the cyclical redundancy check value is generated and placed in the cyclical redundancy check field of the header for the particular sector at a first step 30. In order to accomplish this, the invalid bits and the revision number bits of the particular sector are masked out in generating the cyclical redundancy check value. Whenever the sector is rewritten during cleanup or otherwise, these bits are masked out of the data in the header used for generation of the cyclical redundancy check value. Moreover, when a header is written or rewritten, the bits in which the cyclical redundancy check value itself is stored are masked out. By masking these bits which change, the cyclical redundancy check value remains constant even though various fields within the header change.

When a header is read for any of the read, write, or cleanup operations, the process first does a seek for the correct sector at a step 32. In one embodiment of the invention, this is a set associative seek of eight possible sector numbers. However, a different sized set associative seek or a direct mapped seek is also possible depending on the number of storage positions available in the table 17 for the physical address. In order to accomplish this seek, a count is set to zero at a step 33, the count value is tested at a step 35 to determine whether the set has been completed (eight different sectors tested in the one embodiment), and (presuming a count less than the maximum) then the count is incremented by one at a step 36.

Then the first header is read at a step 40. With each sector checked, the logical sector number is compared to the logical sector number sought at a step 41. If the numbers are not the same, the process moves to the next sector by returning to step 35, checking the count to determine if the count is at the maximum, and incrementing the count to increment the address value at step 36. If at step 41, the sector number sought matches the sector number stored in the header, the process moves to test the validity of the sector at a step 43. If the sector is not valid, the process moves back to step 35 to test the count and then to step 36 to increment the count to the next address. This continues until the seek process ultimately detects the correct logical sector and a valid indication. If for some reason after the maximum number of addresses have been tested, a correct valid sector is not found in the seek process, the process returns to step 35. At step 35, the maximum count switches the process to a step 37 at which a "sector not found" indication is returned.

When the process detects the correct logical sector number and determines that the sector is valid, a cyclical redundancy check value is calculated at a step 45 from the data stored in the header masking out the stored cyclical redundancy check value, the valid bits, and the revision number as indicated at an intervening step 44. This calculated cyclical redundancy check value is compared to the cyclical redundancy check value stored in the header for the selected address at a step 47. Only when the cyclical redundancy check values and the logical sector numbers for a valid sector both check is the header considered to be correct and selected. In such a case, the process moves to a step 49 which is indicated a one in which the current host computer operation is completed.

If, however, anything has changed in the header of a given sector because of some error, the cyclical redundancy check values will not compare and the search process continues on to a step 51. At step 51, a test is made to determine whether the last header on the block has just been tested. If the logical sector numbers are the same for a valid sector but the cyclical redundancy check values do not compare and the header is not the last header in the block, the header for the sector sought is marked dirty at a step 56 by zeroing the valid bits. Additionally, the header for the next sector is also marked dirty. This is necessary because the failure of the header could be in the pointer value. Were the pointer value to be incorrect, then an incorrect data field would be returned. Moreover, since the length of the data in each sector is measured by not only the pointer in that header but also by the pointer in the header of the previous sector, a failure of the pointer for the sector sought would cause the next sector to also be incorrect; and it must be so marked. When the sectors are marked invalid by the cyclical redundancy check process, they are no longer considered to contain useful data and will be ultimately cleaned up by the cleanup process.

Then the process continues to step 35 where it continues to look for a correct valid sector with a cyclical redundancy check value which compares to that stored. As will be seen, if no such sector is found, then the process will ultimately return a "sector not found" flag at a step 37.

If at step 51 the header tested is found to be the last header in the block, then there is no reason to continue the search. In the embodiment illustrated, the header is marked invalid at a step 52 by zeroing the valid bits, all of the remaining free flash on the block is marked invalid at a step 53, and the count is switched to maximum at a step 54. Then, the process returns to step 35 where it tests the maximum value, finds the maximum, and at step 37 returns a flag indicating that the sector was not found. The remainder of the free sectors on the block are marked dirty at the step 53 by marking the block data structure 21 to indicate that no free space remains on the block. This is done because a size value for each sector depends upon a correct pointer in the preceding sector. Thus, all of the sectors in the block which may be written after a last failed sector may have incorrect pointers and thus may be incorrectly positioned.

Another way to handle this problem is to mark the single last block dirty and start a new sector at some predetermined position such as 512 bytes after the failed last block. The advantage of marking all of the free sectors remaining on the block as dirty is that the block will then probably have a large number of dirty sectors and will, consequently, be cleaned up by the cleanup process much more rapidly than if a single block were to be marked dirty and a new sector started at some predetermined position beyond the dirty sector. If the type of failure which causes the cyclical redundancy check to fail is a read failure which has been caused by a disturb condition in the array (a prevalent type of read failure), such a failure will be cured by cleaning up the block.

As was pointed out earlier, it is not obvious that a cyclical redundancy check can be used with a changing field. However, by masking out the bits which are changing in accordance with this invention such a process is possible. To overcome the error which might occur due to this masking, the present invention also duplicates the valid bits; and each of these bits must be in the valid condition for the sector data to be considered to be valid. Because of this redundancy of the valid bits, the masking of these bits for the cyclical redundancy check does not reduce the overall reliability of the header.

The revision number bits also change as data is cleaned up or certain attempts to write occur, but these bits are not duplicated. Consequently, it would be expected that the reliability of the storage would deteriorate with these bits masked. A revision number is always placed in a header. However, the revision number is only incremented to a new value in a header during cleanup and when an attempt to write occurs with a block on a chip undergoing cleanup. The revision number of the old sector is read and incremented to obtain a new higher revision number for the new sector. The revision number is used if power fails before the cleanup process has been completed in order to allow the generation of an accurate table 17 when power is reapplied. In generating the table, the revision numbers are compared and the higher revision number is selected to indicate the latest version of the sector. The details of this revision number operation are disclosed in U.S. patent application Ser. No. 07/969,463, entitled Method for Writing to a Flash Memory Array During Erase Suspend Intervals, S. Wells et al, filed Oct. 30, 1992, and assigned to the assignee of the present invention.

Because the incrementing of the revision number is occurring during a cleanup period, should the revision number be incorrect it will have no effect on the validity of the header. The incorrect revision number will be incremented and stored. Whatever revision number is stored will be one greater than the incorrect number and will serve the purpose of comparison for which the revision number is provided. Moreover, if the revision number is the only failure, the remainder of the header has not failed and should not be invalidated. Thus, masking the revision bits in generating a cyclical redundancy check value does not affect the validity of the header.

A variation in the process described includes reading the header data at a slower rate if a first cyclical redundancy check fails. It has been determined that a great proportion of read errors in a flash EEPROM memory array are caused by the transistors of the memory cells taking longer than the prescribed period to provide an output signal indicative of the state of the cell. Although the state of the cell may be correctly varied and the correct condition stored, the time to read appears to lengthen with the number of switching operations conducted. Consequently, the time required for the signal produced at the output driver to settle to its final state lengthens. Since read failures in flash EEPROM arrays are typically caused by this lengthening of settling times, a read operation with a longer settling time may produce a correct result. In order to accomplish this, the microprocessor of the controller 14 may be set to operate with a greater number of wait states when a first cyclical redundancy check error occurs. Usually, this will cure the problem; and the header data will be correctly read. The Intel 80188 microprocessor is provided with a command for increasing the number of wait states for any particular operation, and this command may be used to slow the read operation which produced the failed cyclical redundancy check.

Another enhancement of the process of the present invention increases the speed of operation in implementing a cyclical redundancy check. Although the normal method for generating these values is detailed at length in the Crenshaw article cited above, one embodiment of the present invention uses a more rapid process. Since the eight bits available for the cyclical redundancy check value allow only 256 possible values, a table 19 of these values is constructed. Then a number is selected from the table 19 rather than generated using the typical cyclical redundancy check generating circuitry of the prior art. The offset into the table 19 is derived by selecting an initial value (FFhex is utilized in this embodiment). This number and the most significant byte of the header are subjected to a logical XOR operation. The value obtained by this operation is used as a first offset into the table 19 to give a value. This value is XORed with the next byte of the header, and the value obtained is used as a second offset into the table. The second value obtained from the table is XORed with the next byte of the header to obtain another offset into the table. When the bytes containing the valid and revision bits are encountered, those values are masked by zeroing the values. This continues until all seven bytes (excluding the cyclical redundancy byte) have been subjected to the XOR operation. The value obtained from the last such XOR operation gives the ultimate offset into table 19 which provides the cyclical redundancy check value. FIG. 4 illustrates the steps of this process.

As has been discussed above, it is possible to utilize error detecting and correcting code instead of the error detecting cyclical redundancy check. In such a case, when a sector seek occurs and a valid logical sector is found but the error detection shows an error exists in the header bits, an attempt to correct the header bits takes place before the header is rejected and marked invalid. If correction is possible, the header is corrected, and the data in the sector is saved.

As will be understood from the above discussion, although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A method for assuring the reliability of non-data fields in flash EEPROM memory arrays comprising the steps of:
   generating a cyclical redundancy check value for each non-data field written and storing the cyclical redundancy check value with the field as the field is written,
   generating a new cyclical redundancy check value each time a non-data field is read,
   comparing a cyclical redundancy check value stored with a field with a new cyclical redundancy check value generated when a field is read,
   and invalidating a field for which a cyclical redundancy check value stored with a field and a new cyclical redundancy check value generated when a field is read do not compare.

2. A method for assuring the reliability of non-data fields in flash EEPROM memory arrays as claimed in claim 1 in which data in the field may change between when a field is written and when a field is read in which the step of comparing a cyclical redundancy check value stored with a field with a new cyclical redundancy check value generated when a field is read further comprises the step of masking bits of a field which may change.

3. A method for assuring the reliability of non-data fields in flash EEPROM memory arrays as claimed in claim 2 in which data in the field may change between when a field is written and when a field is read in which the step of masking bits of a field which may change comprises masking valid bits of a field.

4. A method for assuring the reliability of non-data fields in flash EEPROM memory arrays as claimed in claim 2 in which data in the field may change between when a field is written and when a field is read in which the step of masking bits of a field which may change comprises masking revision bits of a field.

5. A method for assuring the reliability of non-data fields in flash EEPROM memory arrays as claimed in claim 1 in which the steps of generating a cyclical redundancy check value and a new cyclical redundancy check value each comprise the steps of:
   establishing a table of cyclical redundancy check values;
   selecting an initial value from the table of cyclical redundancy check values;
   performing a logical XOR operation using the initial value and a selected number of bits of a field;
   using the result of the logical XOR operation to select a cyclical redundancy check value from the table;
   performing a logical XOR operation using the cyclical redundancy check value selected from the table and a next selected number of bits of a field; and
   continuing the operation of using the result of the logical XOR operation to select a cyclical redundancy check value from the table, and performing a logical XOR operation using the cyclical redundancy check value selected from the table and a next selected number of bits of a field until all bits of the field have been utilized.

6. A method for assuring the reliability of non-data fields in flash EEPROM memory arrays as claimed in claim 5 in which each step of performing a logical XOR operation using the cyclical redundancy check value selected from the table and a next selected number of bits of a field includes a step of masking bits of a field which may change.

7. A method for assuring the reliability of non-data fields in flash EEPROM memory arrays as claimed in claim 6 in which data in the field may change between when a field is written and when a field is read in which the step of masking bits of a field which may change comprises masking valid bits of a field.

8. A method for assuring the reliability of non-data fields in flash EEPROM memory arrays as claimed in claim 6 in which data in the field may change between when a field is written and when a field is read in which the step of masking bits of a field which may change comprises masking revision bits of a field.

9. A method for assuring the reliability of non-data fields in flash EEPROM memory arrays as claimed in claim 6 in which data in the field may change between when a field is written and when a field is read further including the step of duplicating bits of a field which changes.

10. A method for assuring the reliability of non-data fields in flash EEPROM memory arrays as claimed in claim 6 in which data in the field may change between when a field is written and when a field is read further including the step of duplicating bits of a field which changes if the change would cause an error in the use of the field.

11. A method for assuring the reliability of non-data fields in flash EEPROM memory arrays as claimed in claim 5 in which data in the field may change between when a field is written and when a field is read further including, before the step of invalidating a field for which a cyclical redundancy check value stored with a field and a new cyclical redundancy check value generated when a field is read do not compare, a step of repeating the process at a slower speed when a cyclical redundancy check value stored with a field and a new cyclical redundancy check value generated when a field is read do not compare.

12. A method for assuring the reliability of non-data fields in flash EEPROM memory arrays as claimed in claim 11 in which the step of repeating the process at a slower speed when a cyclical redundancy check value stored with a field and a new cyclical redundancy check value generated when a field is read do not compare comprises setting a microprocessor running the process to include a greater number of wait states in running the process.

13. A method for assuring the reliability of non-data fields in flash EEPROM memory arrays comprising the steps of:
generating an error detection value for each non-data field written and storing the error detection value with the filed as the field is written;
generating a new error detection value each time a non-data field is read,
comparing an error detection value stored with a field with a new error detection value generated when a field is read;
and invalidating a field for which an error detection value stored with a field and a new error detection value generated when a field is read do not compare.

14. A method for assuring the reliability of non-data fields in flash EEPROM memory arrays as claimed in claim 13 in which data in the field may change between when a field is written and when a field is read in which the step of comparing an error detection value stored with a field with a new error detection value generated when a field is read further comprises the step of masking bits of a field which may change.

15. A method for assuring the reliability of non-data fields in flash EEPROM memory arrays as claimed in claim 14 in which data in the field may change between when a field is written and when a field is read in which the step of masking bits of a field which may change comprises masking valid bits of a field.

16. A method for assuring the reliability of non-data fields in flash EEPROM memory arrays as claimed in claim 14 in which data in the field may change between when a field is written and when a field is read in which the step of masking bits of a field which may change comprises masking revision bits of a field.

17. A method for assuring the reliability of non-data fields in flash EEPROM memory arrays as claimed in claim 13 in which the steps of generating an error detection value and a new error detection value each comprise the steps of:
established a table of error detection values;
selecting an initial value from the table of error detection values;
performing a logical XOR operation using the initial value and a selected number of bits of a field;
using the result of the logical XOR operation to select an error detection value from the table;
performing a logical XOR operation using the error detection value selected from the table and a next selected number of bits of a field; and
continuing the operation of using the result of the logical XOR operation to select an error detection value from the table, and performing a logical XOR operation using the error detection value selected from the table and a next selected number of bits of a field until all bits of the field have been utilized.

18. A method for assuring the reliability of non-data fields in flash EEPROM memory arrays as claimed in claim 17 in which each step of performing a logical XOR operation using the error detection value selected from the table and a next selected number of bits of a field includes a step of masking bits of a field which may change.

19. A method for assuring the reliability of non-data fields in flash EEPROM memory arrays as claimed in claim 18 in which data in the field may change between when a field is written and when a field is read in which the step of masking bits of a field which may change comprises masking valid bits of a field.

20. A method for assuring the reliability of non-data fields in flash EEPROM memory arrays as claimed in claim 18 in which data in the field may change between when a field is written and when a field is read in which the step of masking bits of a field which may change comprises masking revision bits of a field.

21. A method for assuring the reliability of non-data fields in flash EEPROM memory arrays as claimed in claim 18 in which data in the field may change between when a field is written and when a field is read further including the step of duplicating bits of a field which changes.

22. A method for assuring the reliability of non-data fields in flash EEPROM memory arrays as claimed in claim 18 in which data in the field may change between when a field is written and when a field is read further including the step of duplicating bits of a field which changes if the change would cause an error in the use of the field.

23. A method for assuring the reliability of non-data fields in flash EEPROM memory arrays as claimed in claim 17 in which data in the field may change between when a field is written and when a field is read further including, before the step of invalidating a field for which an error detection value stored with a field and a new error detection value generated when a field is read do not compare, a step of repeating the process at a slower speed when an error detection value stored with a field and a new error detection value generated when a field is read do not compare.

24. A method for assuring the reliability of non-data fields in flash EEPROM memory arrays as claimed in claim 23 in which the step of repeating the process at a slower speed when an error detection value stored with a field and a new error detection value generated when a field is read do not compare comprises setting a microprocessor running the process to include a greater number of wait states in running the process.

* * * * *